(12) United States Patent
Baur et al.

(10) Patent No.: US 6,445,568 B1
(45) Date of Patent: Sep. 3, 2002

(54) PLASTIC HOUSING WITH CONDENSATION PROTECTION FOR ELECTRIC AND ELECTRONIC ASSEMBLIES

(75) Inventors: Richard Baur, Pfaffenhofen; Guenter Fendt; Alfons Woehrl, both of Schrobenhausen; Engelbert Woerle, Kuehbach, all of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/723,743

(22) Filed: Nov. 27, 2000

(30) Foreign Application Priority Data

Nov. 25, 1999 (DE) .......................... 199 56 675

(51) Int. Cl.$^7$ ................................ H02B 1/00
(52) U.S. Cl. .................. 361/600; 361/679; 361/683; 361/688; 361/690; 361/720; 361/724; 174/50; 174/50.51; 174/52.1
(58) Field of Search .................. 361/674, 676–679, 361/688–690, 704, 705, 816, 818, 819; 174/50, 50.51, 35 R, 52.1, 52.2

(56) References Cited

U.S. PATENT DOCUMENTS

| 3,851,225 | A | * | 11/1974 | Luchetta ..................... 361/764 |
| 4,985,845 | A | | 1/1991 | Gotz et al. |
| 5,546,804 | A | * | 8/1996 | Johnson et al. ............... 73/431 |
| 5,653,559 | A | * | 8/1997 | Stieb et al. .................. 405/363 |
| 5,726,858 | A | * | 3/1998 | Smith et al. ................. 361/705 |
| 5,787,576 | A | * | 8/1998 | Warren et al. ................ 29/832 |
| 5,872,332 | A | * | 2/1999 | Verma ....................... 174/35 C |
| 6,210,014 | B1 | * | 4/2001 | Kubizne et al. .............. 362/96 |
| 6,288,329 | B1 | * | 9/2001 | Kopp et al. ................. 174/35 R |

FOREIGN PATENT DOCUMENTS

| DE | 2138376 | 7/1971 |
| DE | 3425418 | 1/1986 |
| DE | 3800077 | 7/1989 |
| DE | 3828000 | 2/1990 |
| DE | G9004684 | 8/1990 |
| DE | 3924341 | 1/1991 |
| DE | G9200134 | 4/1992 |
| DE | 4313022 | 5/1994 |
| DE | 19641552 | 12/1997 |
| DE | 19727337 | 4/1998 |
| DE | 19717032 | 10/1998 |
| EP | 0401495 | 12/1990 |
| JP | 06077669 | 3/1994 |
| JP | 10013044 | 1/1998 |
| JP | 10215077 | 8/1998 |
| JP | 10242674 | 9/1998 |
| JP | 11177251 | 7/1999 |
| JP | 11285034 | 10/1999 |

* cited by examiner

Primary Examiner—Boris L. Chervinsky
(74) Attorney, Agent, or Firm—W. F. Fasse; W. G. Fasse

(57) ABSTRACT

A housing for an assembly of electronic components mounted on a circuit board is predominantly made of plastic, and includes a plastic housing cover and a housing floor. Metal surfaces are provided in the housing to preferentially condense moisture from the air in the housing upon cooling, to avoid condensation on the circuit board or the electronic components. The metal surfaces may be a metal casing around an electronic component, a metallized layer deposited on an inner surface of the housing, a metal insert in the housing, a metal housing floor, or an additional metal floor plate adjacent to a plastic housing floor. A hydrophobic film enforces condensate droplet formation, and channels and drain holes drain the condensate droplets out of the housing. An encapsulating film is unnecessary on the electronic components, because condensation on these components is avoided.

16 Claims, 1 Drawing Sheet

PLASTIC HOUSING WITH CONDENSATION PROTECTION FOR ELECTRIC AND ELECTRONIC ASSEMBLIES

PRIORITY CLAIM

This application is based on and claims the priority under 35 U.S.C. §119 of German Patent Application 199 56 675.5, filed on Nov. 25, 1999, the entire disclosure of which is incorporated herein by reference.

FIELD OF THE INVENTION

The invention relates to a plastic housing for receiving an assembly of electric and electronic components mounted on a circuit board, particularly providing protection against condensation of moisture on the electric and electronic components.

BACKGROUND INFORMATION

It has previously been typical to enclose electric and electronic components mounted on circuit boards within metal housings for protecting the electric and electronic assemblies from external damage, environmental elements, etc. It is recently becoming common to provide synthetic plastic housings instead of the metal housings for enclosing such electric and electronic assemblies, especially in the field of electrical and electronic systems for motor vehicles, in view of the reduced weight, reduced cost, and advantageous production methods for the plastic housings in comparison to the metal housings.

While such plastic housings are typically protected against direct entry of water sprays or the like, they are often not hermetically tightly sealed, so that humidity or moisture in the air can penetrate into the interior of such plastic housings. This leads to the disadvantage, that a reduction in the environmental mental temperature can cause the humidity or moisture in the air within the housing to condense therein. In this context, the moisture predominantly or preferentially condenses on any metal surfaces within the housing, because such metal surfaces have a higher thermal conductivity and a more-rapid temperature variation response than the plastic material of the plastic housing itself. Thus, the condensate often forms predominantly on the electric and electronic components of the assembly within the housing, rather than on the interior wall surface of the plastic housing itself. In comparison, such condensate within a metal housing would typically condense on the surfaces of the metal housing itself, where it would not be dangerous or damaging to the electric and electronic components.

In order that the moisture condensing on the electric and electronic components does not lead to short-circuiting, current leakage or corrosion of the electric and electronic assemblies, in many cases the electric and electronic components are sealed with a protective lacquer, resin layer, or other encapsulants. Such protective measures, however, cause the disadvantage that the electric and electronic components are no longer accessible in order to test the components, update or maintain software, monitor the long-term behavior thereof, or the like. For this reason, it often becomes necessary to exchange the entire electric or electronic assembly such as a control device, rather than simply exchanging individual components thereof, which thus leads to higher maintenance and repair costs.

SUMMARY OF THE INVENTION

In view of the above, it is an object of the invention to provide a housing for receiving electric and electronic assemblies, wherein the housing is predominantly made of plastic and includes structural measures to help avoid the condensation of humidity or moisture onto the electric and electronic components enclosed within the housing in the event of temperature variations. The invention also aims to avoid the need for providing protective seal layers for encapsulating the electric and electronic components within such a housing. It is a further aim of the invention to avoid the disadvantages of the prior art, and to achieve additional advantages, as apparent from the present specification.

The above objects have been achieved according to the invention in an arrangement comprising a housing for receiving electric and electronic assemblies including electric and electronic components mounted on a circuit board. According to the invention, the housing includes a housing floor as well as a housing lid or cover, whereby at least the cover is made of plastic. Furthermore, a metal component with at least one surfacially extending metal surface is arranged within the housing in order to preferentially condense moisture such as air humidity on this metal surface. For example, the metal component including the metal surface may comprise a metal casing or enclosure provided around at least one of the electric or electronic components, or a metallizing layer provided on the inner surface of the plastic housing itself, or a metal insert member that is inserted into or onto the plastic housing, or an additional metal floor plate arranged adjacent to or along the housing floor, or the housing floor itself may be a metal component.

When a temperature change leads to condensation of any humidity or other moisture within the housing, the condensation will predominantly or preferentially occur on the metal surface provided for this purpose within the housing. Thus, the condensation will not occur directly on the electric or electronic components, and it becomes unnecessary to provide a protective encapsulating layer on the electric and electronic components. Further according to the invention, condensate drain holes and additional means may be provided to channel and drain away any condensate that forms.

In this manner, according to the invention, the dangers of short-circuiting, circuiting, leakage currents, and corrosion can be avoided. Also, the electric and electronic components within the housing remain freely accessible for testing and maintenance purposes, so that any necessary changes can be carried out. Also, for recycling the overall housing-enclosed assembly, it is a simple matter to separate the metal parts and the plastic parts for separately recycling these respective parts. The invention is especially suitable for use in plastic housings enclosing electric and electronic components, such as those typically included in control devices provided in motor vehicles.

BRIEF DESCRIPTION OF THE DRAWINGS

In order that the invention may be clearly understood, it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1:
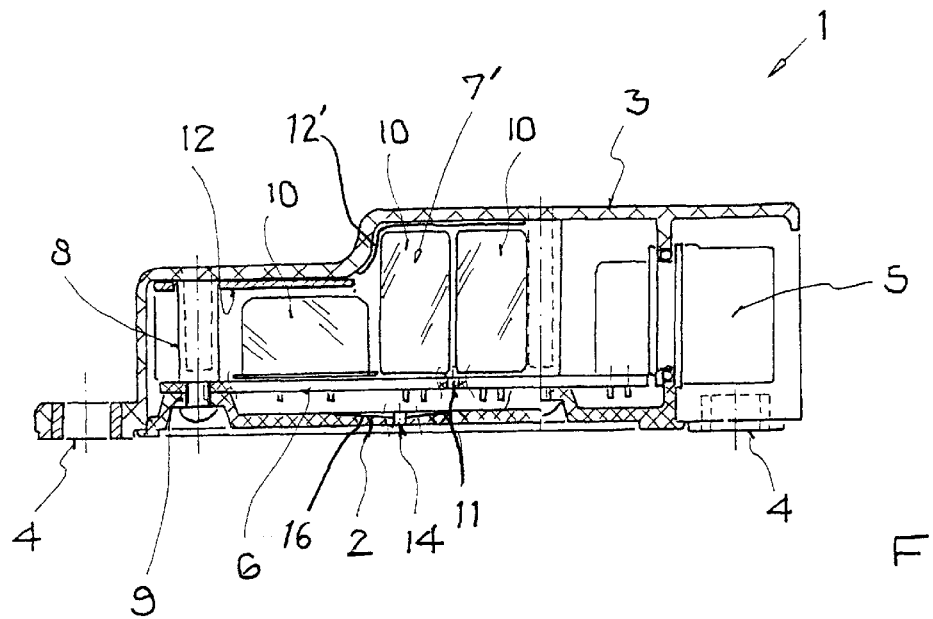
FIG. 1 is a cross-sectional view of a first plastic housing according to the invention, enclosing an assembly of electric and electronic components, wherein metal surfaces for preferential condensation are provided as metal inserts and metal casings around the electric or electronic components.
Figure 2:
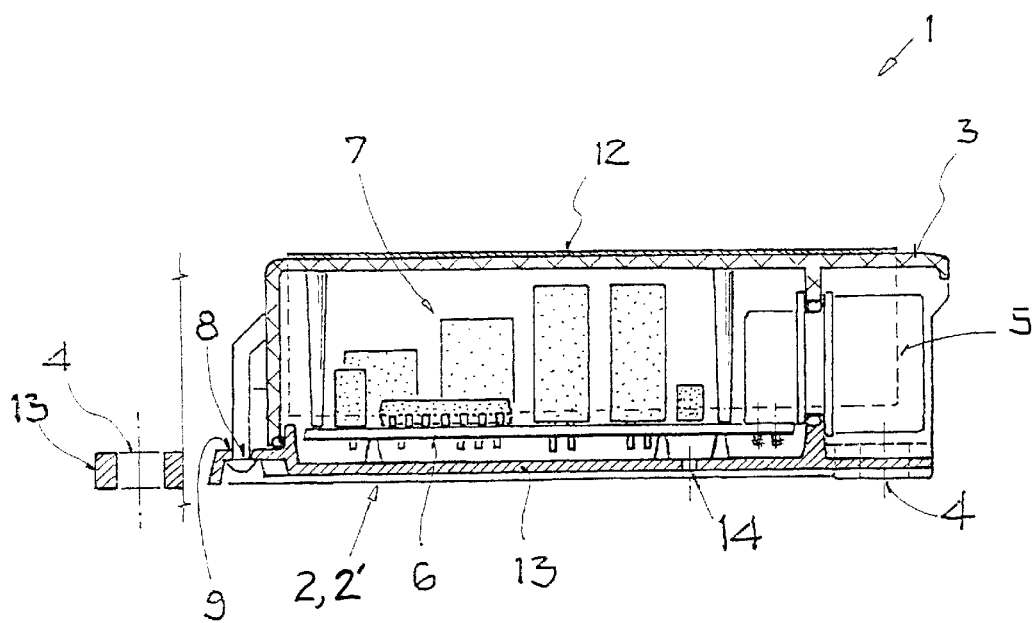
FIG. 2 is a cross-section of a second plastic housing according to the invention, enclosing an assembly of electric and electronic components, wherein metal surfaces for preferential condensation are provided by a metal floor plate and a cover insert.

Both FIGS. 1 and 2 respectively show a housing 1 that is predominantly made of plastic (e.g. at least 50% plastic, or even at least 60, 70 or 80% plastic), and that encloses an interior space therein to be protected against direct entry of water sprays or the like. The housing 1 includes a housing cover or lid 3 made of any conventionally known and suitable plastic, as well as a a housing floor 2 that may be made of metal or a plastic such as a fiber-reinforced composite plastic (e.g. fiberglass-reinforced composite). In order to mount and secure the housing 1 in a motor vehicle, for example using screws or rivets, suitable mounting lugs or eyes 4 are formed onto the housing cover 3. An electrical connector plug unit 5 is integrated into the cover 3.

A circuit board 6 with an assembly of electric and electronic components 7, 7'mounted thereon is arranged in the interior of the housing 1. Pins or studs 8 protrude from the housing cover 3 and engage suitable bushings 9 provided in the housing floor 2 so as to securely connect the housing floor 2 with the housing cover 3. For example, the free ends of the pins or studs 8, which may comprise the same plastic material as the cover 3, are first inserted through the respective bushings 9, and are then ultrasonically heated and upset or pressed flat to form a rivet head. These or similar pins 8 may additionally serve as alignment or positioning means to achieve an exact positioning and orientation of the circuit board 6 within the housing 1.

As is generally known, air has a higher capacity to take up humidity or moisture in the form of water vapor in accordance with the increasing temperature of the air. In other words, at a higher environmental temperature, the air can take up more moisture in the form of water vapor than it can at a lower environmental temperature. As a result, when warm air with a higher moisture content cools down due to a reduction of the environmental temperature, the water vapor contained in the air becomes over-saturated and therefore condenses on any surfaces that are below the dew point temperature. The resulting condensate is in the form of a liquid water film or droplets, which especially or preferentially form on the surfaces of materials that adapt more quickly to the falling environmental temperature, i.e. those surfaces that cool down rather quickly. Materials which quickly adapt to a changing environmental temperature are, for example, metals and other materials having a higher thermal conductivity.

In view of the above, there arises the problem, that the water vapor in the humid air within the housing 1 will have a tendency to primarily condense on the metal components such as the circuit board 6 or the electric and electronic components 7, 7', which would lead to the development of leakage currents, short-circuits, or spark-overs of the respective electric or electronic components. Additionally, the locations wetted by condensate will be subject to increased corrosion, which will lead to the eventual failure of the entire assembly. This is especially true because the water vapor will not tend to condense as readily directly on the plastic surfaces of the housing 1. In order to avoid the preferential condensation of moisture onto the circuit board 6 and the electric or electronic component 7,7', the invention provides other surfacially extending metal surfaces within the interior of the housing 1 so that the air humidity or other moisture will predominantly and preferentially condense on these specially provided metal surfaces and thereby preferentially avoid the condensation of moisture directly on the sensitive circuit board 6 and electric or electronic components 7, 7'. Thereby, it becomes possible to omit a protective lacquer or resin encapsulating coating on the circuit board and the components 7, 7', while still using an economical and advantageous plastic housing instead of a metal housing.

In the embodiment of the housing 1 shown in FIG. 1, the metal surfaces provided for preferential condensation thereon are provided by metal casings 10 arranged around certain electrical or electronic components 7' that are generally not sensitive to harm by condensation. In other words, these components 7' are provided with a metal casing 10 rather than the typical plastic casing or packaging of such components. For example, suitable components 7' that are not sensitive to condensation, so that they may be provided with a metal casing 10 in order to cause deliberate preferential or increased condensation on this metal casing 10, include relays, sensors, batteries, electrical accumulators capacitors, and the like. Through-holes 11 are provided in the circuit board 6 and condensate drain holes 14 are provided in the housing floor 2, so that any condensate accumulating on the metal casings 10 during a cooling of the assembly will flow down from the metal casings 10 and through the respective holes 11 and 14 to exit out of the housing 1.

FIG. 1 further shows a second possibility for realizing the specially provided metal surfaces for preferential condensation thereon. Namely, the inner surface of the housing cover 3 or a portion thereof may have a layer of metal 12' vapor-deposited thereon, or a metal hood or a metal insert 12 can be positioned or inserted into the housing in the area of the cover 3. Particularly, the contour of this metal hood or insert 12 preferably at least approximately or exactly corresponds to the inner contour tour of the housing cover 3. Also, in this context, condensate drain holes 14 provided in the housing floor 2 serve to carry away condensate that forms on the insert 12 or the like during a cooling of the assembly. This embodiment including metal surface coatings 12' or inserts 12 on the interior surface of the housing cover 3 can be used separately or in combination with the above described metal casings 10. The provision of a metal surface coating 12' or insert 12 within the housing cover 3 provides the additional advantage of electromagnetically shielding the electric or electronic components 7, 7'.

If no additional measures are provided, the air humidity or other moisture would typically condense in the form of a continuous water film on the metal casings 10, the metallized inner surface 12' of the housing cover 3, or on the metal insert parts 12, depending on the particular embodiments as described above, during cooling of the arrangement. Such a film of condensate will tend to cling and remain on the surface on which it condensed, until this film of moisture is again vaporized upon a renewed warming of the environment and particularly of the housing-enclosed assembly. The moisture will then be present as humidity and water vapor contained in the air within the housing. Then, upon renewed cooling, the water vapor will again condense, leading to an increased formation of condensate. As additional moisture or humidity enters the housing from the exterior, an ever-increasing moisture content within the housing can occur. Therefore, it is recommendable to remove the condensate from the interior of the housing 1. This can be achieved by draining the condensate through drain holes 14 as mentioned above.

In order to be able to collect and drain the condensate through the drain holes 14 to the outside of the housing 1, however, the continuous condensate film must first be disrupted in order to separate the condensate into the form of individual droplets. Such a droplet formation can be enforced by reducing the surface tension of the condensate water, which can be achieved by providing a water shedding or hydrophobic film on the respective metal surfaces, for example by oiling the metal surfaces to form an oil film thereon. Additionally, grooves, channels, or small protrusions can be provided to direct the flowing water droplets toward and into the drain holes 14. Due to the mass and reduced surfaces roughness of the metal surfaces, the formed water droplets will easily run off of these surfaces and be channeled into the drain holes 14.

FIG. 2 shows a further embodiment for providing the metal surfaces on which condensation will preferentially take place, which may be used individually or in combination with either one or both of the possibilities that have been described above in connection with FIG. 1. In the present embodiment of FIG. 2, the housing 1 includes a housing floor 2' made of metal, so that the specially provided metal surfaces are surfaces of this metal housing floor 2'. Additionally, this metal housing floor 2' serves as a heat sink for cooling the electric or electronic assembly. This embodiment of the invention is especially advantageous if the housing floor 2' is not oriented horizontally, but rather at an angle relative to horizontal. In this context, the formation of condensate droplets rather than a condensate film can similarly be achieved by reducing the surface tension of the condensate water, for example by providing an oil film on the metal housing floor 2'. The condensed droplets of water will then be directed along channels, grooves or protrusions to flow into the drain holes 14 and thus out of the housing 1.

Another alternative embodiment is similar to the provision of a metal housing floor 2', but instead uses a plastic housing floor in combination with an additional metal floor plate 13 that is arranged or inserted into the housing 1 directly adjacent to the housing floor 2. The moisture within the housing 1 will thus condense preferentially on this metal floor plate 13, whereby the floor plate 13 may be oiled so as to reduce the surface tension of the condensate water and thereby enforce the formation of condensate droplets. These droplets can then run along grooves, channels or protrusions to flow out of the housing 1 to the drain holes 14.

Regardless which particular embodiment of the metal surfaces is provided for facilitating the preferential condensation of water vapor thereon, the total surface area of such a surface or surfaces should be large enough to ensure that the water vapor in the air in the housing condenses sufficiently on this surface to avoid condensation on the electric or electronic components or the circuit board. For example, the specially provided metal surface or surfaces have a surface area that is equal to or greater than 40%, or even 50% or 60% of a total inner surface area of the housing walls that bound the interior space of the housing.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An arrangement comprising:
   a housing that includes a housing cover made of a plastic, and that encloses a housing interior space with air therein;
   an assembly including a circuit board and at least one electric or electronic component mounted on said circuit board, wherein said assembly is arranged in said housing within said housing interior space; and
   a metal component having at least one surfacially extending metal surface, on which water vapor in said air in said housing interior space will condense, arranged in said housing to be exposed to said air in said housing interior space;
   wherein said circuit board has at least one through-hole therein adapted to direct condensate therethrough.

2. The arrangement according to claim 1, wherein said metal component comprises a metal casing that surrounds at least one of said at least one electric or electronic component within said housing interior space, and that includes said metal surface as a surface thereof facing said housing interior space.

3. The arrangement according to claim 2, wherein said component surrounded by said casing is at least one of a relay, a sensor, a battery, a capacitor and an accumulator, which is not sensitive to condensation.

4. The arrangement according to claim 1, wherein said metal component comprises a metallization layer deposited on an inner surface of said housing facing and bounding said housing interior space.

5. The arrangement according to claim 1, wherein said metal component comprises a metal insert part that is inserted into said housing.

6. The arrangement according to claim 1, wherein said metal component comprises a housing floor that is made of a metal, is adapted to be secured to said housing cover so as to enclose said housing interior space in said housing, and includes said metal surface as a surface thereof facing into said housing interior space.

7. The arrangement according to claim 6, wherein said housing floor has at least one condensate drain hole therein adapted to drain condensate out of said housing interior space therethrough.

8. The arrangement according to claim 1, wherein said housing further includes a housing floor that is made of a plastic and is adapted to be secured to said housing cover so as to enclose said housing interior space in said housing.

9. The arrangement according to claim 8, wherein said metal component comprises a metal floor plate arranged adjacent to said housing floor in said housing interior space.

10. The arrangement according to claim 1, further comprising a hydrophobic film on said at least one metal surface, being adapted to cause droplet formation of condensate droplets thereon.

11. The arrangement according to claim 1, wherein said at least one metal surface is configured with at least one of a groove, a channel, and a protrusion thereon, being adapted to direct a flow of condensate therealong.

12. The arrangement according to claim 1, wherein said housing further includes a housing floor adapted to be secured to said housing cover so as to enclose said housing interior space in said housing, wherein said housing floor has a condensate drain hole therein adapted to drain condensate out of said housing interior space therethrough.

13. The arrangement according to claim 1, wherein said housing is entirely made of said plastic.

14. The arrangement according to claim 1, wherein at least 60% of said housing is made of said plastic.

15. The arrangement according to claim 1, wherein said at least one surfacially extending metal surface has a surface area that is equal to or greater than 40% of a total inner surface area of said housing bounding said housing interior space.

16. The arrangement according to claim 1, wherein said at least one electric or electronic component and said circuit board are directly exposed to said air in said housing interior space, and said assembly excludes an encapsulating seal layer provided over said component and said circuit board.

* * * * *